United States Patent [19]

Suthar et al.

[11] Patent Number: 5,047,671

[45] Date of Patent: Sep. 10, 1991

[54] CMOS TO ECL CONVERTER

[75] Inventors: Mukesh B. Suthar, Sunnyvale; Thao T. Tonnu, Lemon Grove, both of Calif.

[73] Assignee: NCR Corporation, Dayton, Ohio

[21] Appl. No.: 257,242

[22] Filed: Oct. 13, 1988

[51] Int. Cl.$^5$ ............................................. H03K 19/12
[52] U.S. Cl. .................................. 307/451; 307/475; 307/263; 307/264
[58] Field of Search ............... 307/443, 448, 451, 475, 307/263, 264

[56] References Cited

FOREIGN PATENT DOCUMENTS 0007019 1/1988 Japan .................................. 307/443

Primary Examiner—John Zazworsky
Assistant Examiner—Margaret Rose Wambach
Attorney, Agent, or Firm—Wilbert Hawk, Jr.; James M. Stover; Stephen F. Jewett

[57] ABSTRACT

A converter circuit for converting binary logic signals from a CMOS circuit into binary signals for an ECL circuit. Two output transistors in the converter circuit are connected in parallel between the $V_{DD}$ CMOS supply voltage and the output of the converter circuit. The resistance across the drain-to-source terminals of the output transistors form a voltage divider network with a pulldown resistor in the ECL circuit. In one embodiment, one of the output transistors is enabled by a logic "1" from the CMOS circuit and the other is enabled only by a logic "0". In another embodiment, one output transistor is always enabled and the other is enabled only by a logic "0" from the CMOS circuit. In both embodiments, the effective resistance across the parallel transistors is different for a logic level "1" and a logic level "0", so that the voltage at the output is also different. The aspect ratio of the output transistors is chosen in order to obtain the desired voltages at the output which correspond to the ECL logic signals.

8 Claims, 3 Drawing Sheets

CMOS TO ECL CONVERTER

BACKGROUND OF THE INVENTION

The present invention relates to signal converting circuits and, more particularly, to a circuit for converting signals from a CMOS (complementary metal-oxide-semiconductor) circuit into signals for an ECL (emitter-coupled logic) circuit.

Computer systems today use circuits implemented in different hardware technology. For example, it is not uncommon to find in one computer both CMOS and ECL circuits. CMOS is often used in very large chips having many transistors (in excess of 100,000) because of the suitability of CMOS in achieving the power dissipation requirements of that many transistors. Other smaller, but faster, chips are normally implemented in ECL.

One problem with having circuits in one system implemented in different hardware technologies is that the same logic levels of the circuit signals are represented by different voltages. For example, in a CMOS circuit, a logic level "1" will typically be represented by ground (0 V) and a logic level "0" will typically be represented by −5 V. An ECL circuit, on the other hand, will typically have a logic level "1" represented by −0.98 V and logic level "0" represented by −1.6 V. It thus becomes necessary to provide a signal converter or interface when the signals from a CMOS circuit are provided to an ECL circuit.

Circuits have been designed for converting CMOS logic signals into ECL logic signals. For example in U.S. Pat. No. 4,704,549, entitled "CMOS to ECL Converter-Buffer", which is assigned to the same assignee as herein, there is shown a circuit having MOS transistors for converting CMOS logic signals to ECL logic signals. One drawback of this circuit is the fact that the transistor that provides the ECL logic level signals at the output of the circuit requires a voltage in addition to the normal voltages ($V_{DD}$ and $V_{SS}$) used to power CMOS devices. An external power source, which increases the cost of the circuit, is necessary to provide the additional voltage. Another drawback of the circuit disclosed in the aforementioned U.S. Pat. No. 4,704,549, as well as other known circuits, is the signal noise that sometimes arises because of the switching of the transistors used in such circuits.

SUMMARY OF THE INVENTION

There is provided, in accordance with the present invention, a converter circuit for converting a first set of logic signals into a second set of logic signals. The circuit includes first and second output transistors that are connected in parallel, with a first terminal of each connected to a power source, and with a second terminal of each connected to the output of the converter circuit for providing the second set of logic signals. The resistances across the output transistors form a voltage divider with the resistance of a circuit at the output which uses the second set of logic signals. The output transistors have control terminals connected so that the first output transistor is enabled in response to a first level signal in the first set of logic signals and the second output transistor is enabled in response to a second level signal in the first set of logic signals. The first output transistor when enabled has a different resistance than the second output transistor when enabled, so that one voltage appears at the output of the converter circuit corresponding to a first level signal in the second set of logic signals when the first output transistor is enabled and a second voltage appears at the output of the converter circuit corresponding to a second level signal in the second set of logic signals when the second output transistor is enabled.

In the embodiments of the invention described herein, the converter circuit is fabricated on a CMOS device and converts signals from the CMOS device into signals for an external ECL device. The output transistors are P-channel MOS transistors, with the drain of each connected to the CMOS power source $V_{DD}$ (approximately 0 V or ground). The source of each of the output transistors is connected at the output of the converter circuit and, by way of a pulldown or termination resistor, to a termination or pulldown voltage source at the ECL device. The pulldown or termination resistor at the ECL device provides the resistance with which the output transistors form a voltage divider.

Since the transistors at the output of the converter circuit are connected to the CMOS power source $V_{DD}$, no external power source is required for the converter circuit other than those already required for CMOS devices. Also, since both of the output transistors of the converter circuit are connected to the same power source ($V_{DD}$), and since one or the other of those transistors is always enabled, there is a constant current path at the output of the converter circuit. The constant current path results in only minimal noise being generated at the output of the converter circuit. Further, the converter circuit is fabricated with minimal components, which both increases speed and reduces cost.

It is therefore an object of the present invention to provide a new and improved signal converter circuit.

It is another object of the present invention to provide such a circuit for converting CMOS logic level signals into ECL logic level signals.

It is yet another object of the present invention to provide such a circuit without the need for external power sources other than those providing the voltages normally required for CMOS devices.

It is still a further object of the present invention to provide a converter circuit of the type just-described which generates minimal electrical noise and which can be fabricated with minimal cost.

These and other objects, features, and advantages of the present invention will become apparent from the following description and the attached drawings, wherein like reference numbers indicate like parts.

DETAILED DESCRIPTION OF THE PREFERRED EMBODIMENTS

Figure 1:
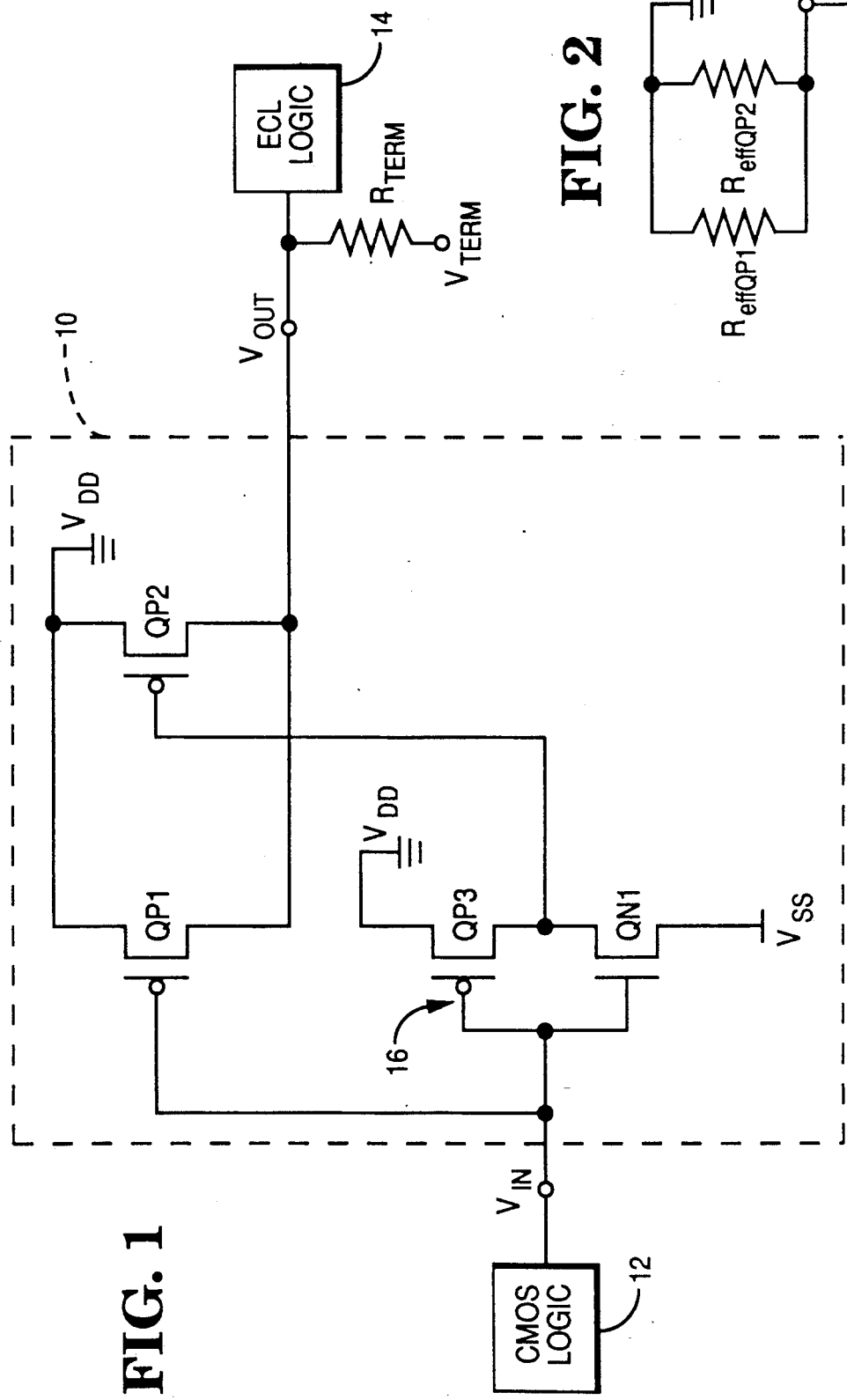
FIG. 1 is a circuit diagram showing a converter circuit in accordance with the present invention, the converter circuit connected between a CMOS circuit and an ECL circuit.

Referring now to FIG. 1, there is seen a CMOS to ECL interface or converter circuit 10 in accordance with the present invention. The circuit 10 connects a CMOS logic device or circuit 12 to an ECL logic device or circuit 14. The binary logic signals at the output of the CMOS circuit 12 are provided as the input $V_{IN}$ to the converter circuit 10. Those binary signals will be at approximately $-5$ V for a logic level "0" and at approximately 0 V for a logic level "1". The output $V_{OUT}$ of the converter circuit 10 will provide binary signals for the ECL circuit 14, at approximately $-1.6$ V for a logic level "0" and approximately $-0.98$ V for a logic level "1". As conventional, and as shown in FIG. 1, a termination or pulldown resistor $R_{TERM}$ is associated with the ECL circuit 14 and connects the ECL circuit to a termination voltage $V_{TERM}$ (approximately $-2$ V).

In the preferred embodiment, the converter circuit 10 is fabricated on the same chip as the CMOS circuit 12. The circuit 10 is powered by the same voltage sources that power the CMOS circuit, namely a positive supply voltage $V_{DD}$ (which is approximately 0 V or ground) and a negative supply voltage $V_{SS}$ (which is approximately $-5$ V).

The converter circuit 10 consists of two P-channel MOS output transistors QP1 and QP2 and a CMOS inverter 16. The CMOS inverter 16 consists of an N-channel MOS transistor QN1 and a P-channel MOS transistor QP3, with the drain of QP3 connected to $V_{DD}$, the source of QN1 connected to $V_{SS}$, and the source of QP3 and the drain of QN1 tied together to provide the output of the inverter 16.

The gate of transistor QP1 is connected to the input of the circuit 10 for receiving the signal $V_{IN}$; and the gate of the transistor QP2 is connected to the output of the inverter 16 (the tied source of QP3 and drain of QN1). The transistors QP1 and QP2 are connected in parallel, with the drain of each connected to $V_{DD}$ and the source of each connected together to provide the circuit output signal $V_{OUT}$.

In operation, when $V_{IN}$ is at a logic level "0", transistor QP1 is enabled and transistor QP2 is disabled. Conversely, when $V_{IN}$ is at a logic level "1", QP2 is enabled and QP1 is disabled. As will be more fully described shortly, the drain-to-source resistances of transistors QP1 and QP2 are selected during the fabrication of QP1 and QP2 so that the voltage level of $V_{OUT}$ will represent one logic level when QP1 is enabled and will be different and represent a second logic level when QP2 is enabled.

Figure 2:
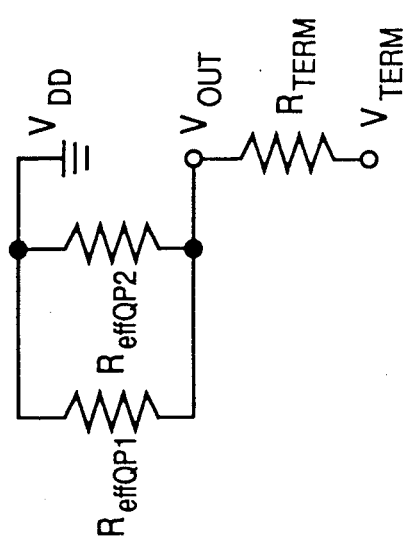
FIG. 2 is a circuit diagram illustrating the voltage divider formed by the output transistors in the converter circuit and the termination resistor at the ECL logic circuit shown in FIG. 1.

The drain-to-source resistances of transistors QP1 and QP2 form a voltage divider with the pulldown resistor $R_{TERM}$ associated with the ECL circuit 14. The voltage divider is illustrated in FIG. 2, where the effective resistances across QP1 and QP2 are represented by $R_{effQP1}$ and $R_{effQP2}$, respectively. When QP1 is enabled and QP2 is disabled, the resistance $R_{effQP2}$ is essentially infinite and thus $V_{OUT}$ (which represents a logic level "0") can be calculated as follows:

$$V_{OUT} = (V_{TERM} - V_{DD}) \frac{R_{effQP1}}{R_{effQP1} + R_{TERM}} + V_{DD} \quad \text{(Equation 1)}$$

Likewise, when QP2 is enabled and QP1 is disabled, the resistance $R_{QP1}$ is essentially infinite and thus $V_{OUT}$ can be calculated as follows:

$$V_{OUT} = (V_{TERM} - V_{DD}) \frac{R_{effQP2}}{R_{effQP2} + R_{TERM}} + V_{DD} \quad \text{(Equation 2)}$$

In a preferred embodiment of the circuit 10, the following circuit values have been chosen when $V_{DD} = 0$ V, $V_{SS} = -5$ V, and when the logic levels "0" and "1" for the ECL logic circuit 14 are desired to be $-1.6$ V and $-0.98$ V, respectively.

| | |
|---|---|
| $R_{effQP1}$ | 96 Ohms |
| $R_{effQP2}$ | 400 Ohms |
| $R_{TERM}$ | 100 Ohms |

The effective drain-to-source resistance of each of the transistors QP1 and QP2 when enabled is determined during fabrication by controlling the channel width-to-length ratio (also known as the "aspect" ratio) of the transistors. This resistance can be approximated from the following equation:

$$R_{effQP} = \frac{1}{\frac{\mu \epsilon}{t_{ox}} \frac{W}{L} |V_{gs} - V_{th}|} \quad \text{(Equation 3)}$$

where "$\mu$" is the effective surface mobility of the electrons in the channel, "$\epsilon$" is the permittivity of the gate insulator, "$t_{ox}$" is the thickness of the gate insulator, "W" is the width of the channel, "L" is the length of the channel, "$V_{gs}$" is the gate-to-source voltage, and "$V_t$" is the threshold voltage. For purpose of reference, such equation is explained in more detail in Weste, N. H. E. and Eshraghian, K. *Principles of CMOS VLSI Design*. (Reading, Mass., Addison-Wesley Publishing Company, 1985) p. 40-42.

The selection of the voltage levels for the output signal $V_{OUT}$ in the circuit 10 by control of the aspect ratio of each of the transistors QP1 and QP2 also permits one to select whether the output voltage $V_{OUT}$ will be inverted or not. That is, if the effective resistance of QP1 (when enabled) is greater than the effective resistance of QP2 (when enabled), then the output of the circuit 10 is non-inverting. Conversely, when the effective resistance of QP2 is greater than the effective resistance of QP1, then the output of the circuit 10 is inverting.

If one uses the voltage divider rule for the circuit shown in FIG. 2, the voltage across the transistors QP1 and QP2 is calculated as follows:

$$V_{OUT} - V_{DD} = (V_{TERM} - V_{DD}) \frac{R_{effQP}}{R_{effQP} + R_{TERM}} \quad \text{(Equation 4)}$$

where $R_{effQP}$ is the effective resistance of the enabled one of the transistors QP1 and QP2. If one further combines the last-mentioned Equation 4 with the previously stated Equation 3 for calculating the effective resistance, then one can calculate the aspect ratio required for the transistors QP1 and QP2 by the following two equations:

(Equation 5a)

-continued $$\left(\frac{W}{L}\right)_{QP} = \left\{R_{TERM}\left(\frac{\mu\epsilon}{t_{ox}}\right)|V_{SS} - V_{DD} - V_{th}|\right\} -$$

$$1\frac{V_{TERM} - V_{ECLLOW}}{V_{ECLOW} - V_{DD}}$$

(Equation 5b)

$$\left(\frac{W}{L}\right)_{QP} = \left\{R_{TERM}\left(\frac{\mu\epsilon}{t_{ox}}\right)|V_{SS} - V_{DD} - V_{th}|\right\} -$$

$$1\frac{V_{TERM} - V_{ECLHIGH}}{V_{ECLHIGH} - V_{DD}}$$

If Equation 5a is used to select the aspect ratio of transistor QP1 and Equation 5b is used to select the aspect ratio of transistor QP2, then the circuit 10 is noninverting. If, on the other hand, Equation 5b is used to select the aspect ratio of transistor QP1 and Equation 5a is used to select the aspect ratio of transistor QP2, then the output of the circuit 10 will be inverting.

It should be appreciated from the description thus far that the converter circuit 10 shown in FIG. 1 has, because of the parallel arrangement of the transistors QP1 and QP2, the advantage of generating minimal noise because of the constant current path from $V_{DD}$ to $V_{TERM}$ (one of either QP1 or QP2 is always enabled). A further advantage that should be appreciated is that the generation of the ECL logic level signals ($V_{OUT}$) is accomplished without a power source at the CMOS circuit and converter circuit (which are both on the same CMOS chip) other than the normal CMOS supply voltages $V_{DD}$ or $V_{SS}$. Hence, no external power supply for the converter circuit 10 is required. Other advantages, such as the minimal number components required for fabricating the converter circuit 10 on a CMOS chip, should also be evident.

Figure 3:
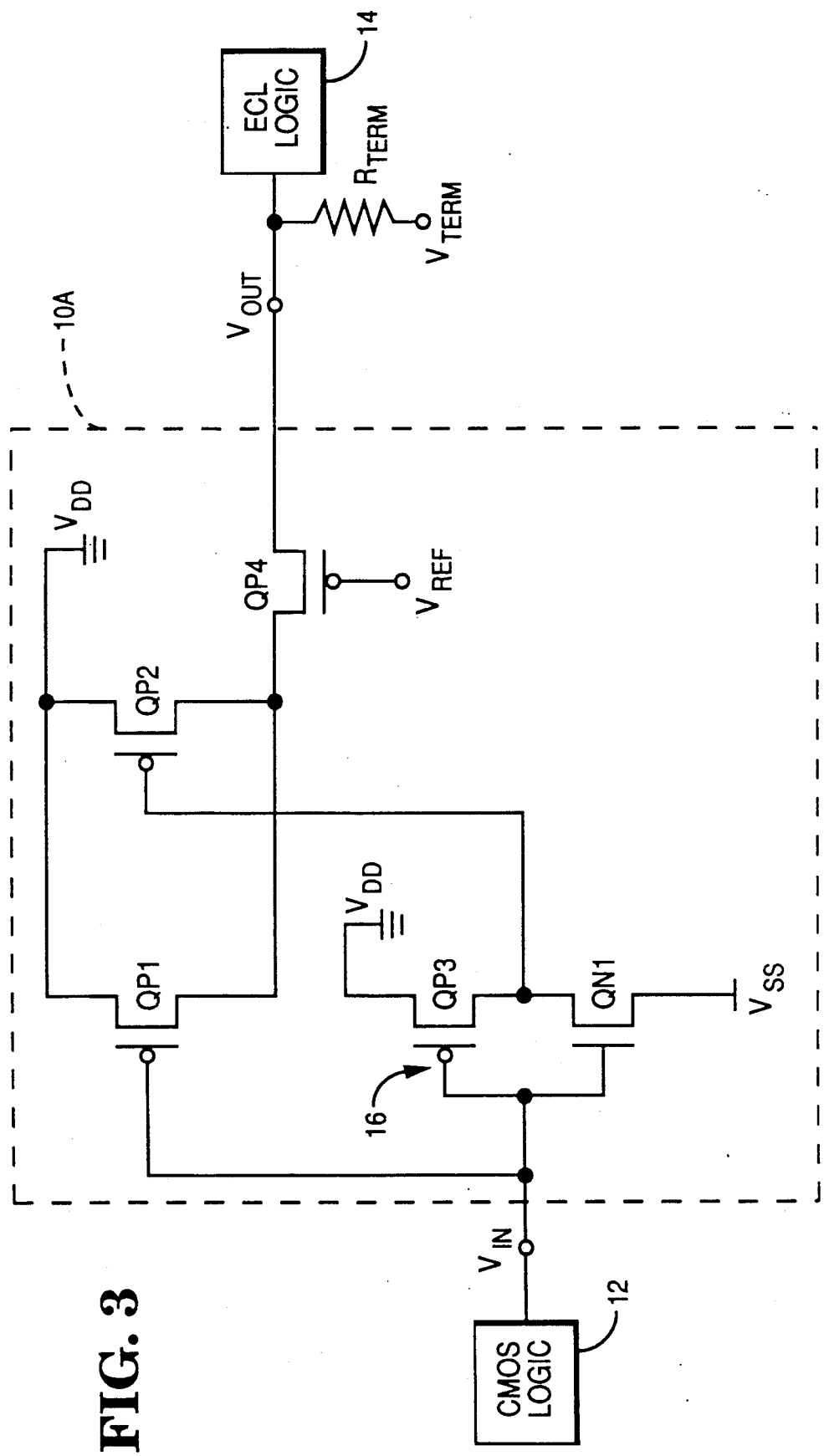
FIG. 3 is a circuit diagram of the converter circuit of FIG. 1, with an additional transistor at the output for limiting the output current of the converter circuit.

FIG. 3 shows a converter circuit 10A connected between a CMOS logic circuit 12 and an ECL logic circuit 14 in the same manner as the converter circuit 10 in FIG. 1. The converter circuit 10A is also identical in construction and operation to the converter circuit 10, except for the connection of a P-channel MOS transistor QP4 between the tied source terminals of the transistors QP1 and QP2 and the output of the circuit 10A. Transistor QP4 is fabricated so that its drain-to-source current flow is clamped at a sufficiently low level to protect the ECL circuit 14 against voltage spikes originating at the supply voltage $V_{DD}$. In a preferred embodiment, the transistor QP4 is chosen so that it reaches saturation, and the current through QP4 is clamped, at 1MA.

Figure 4:
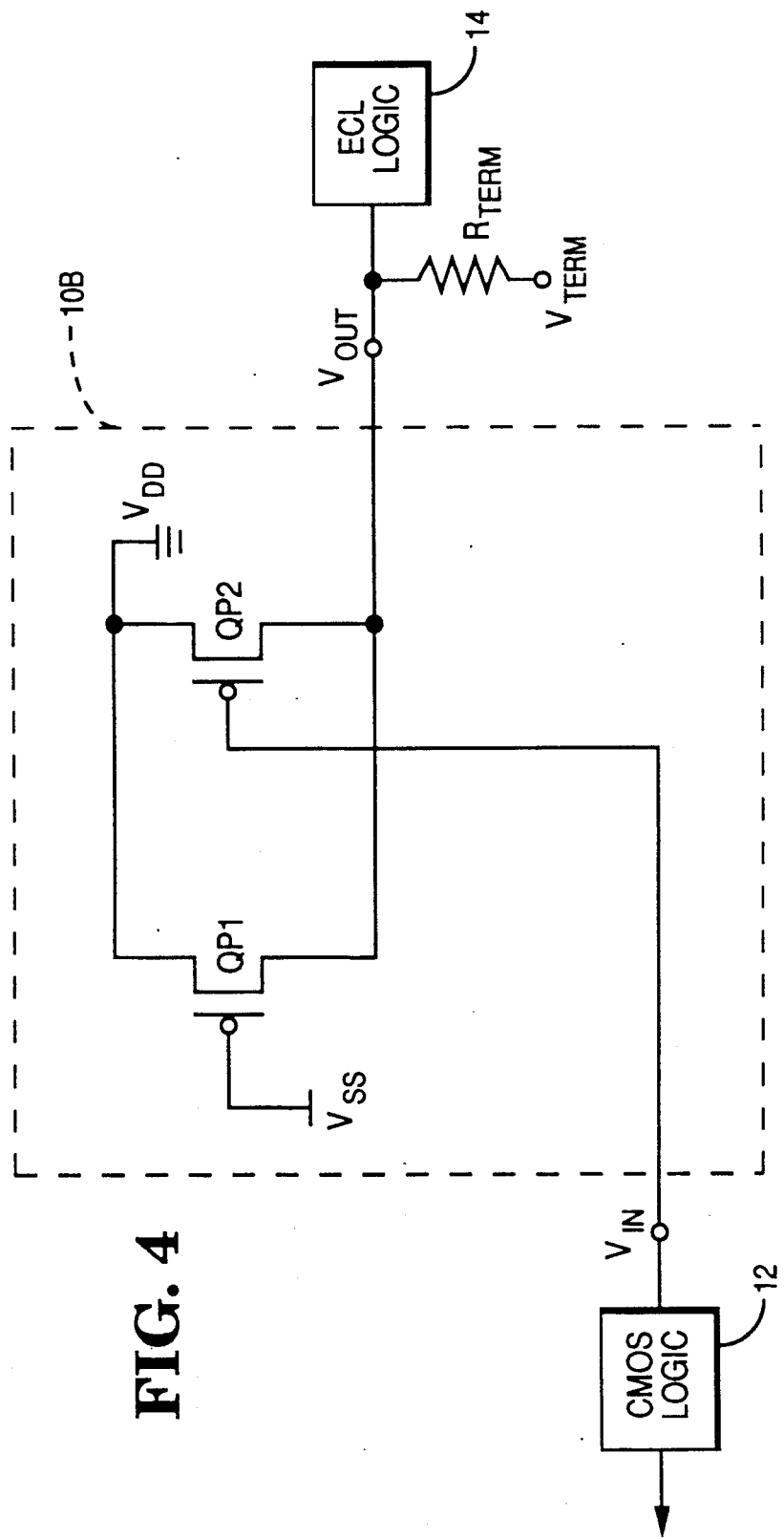
FIG. 4 is a circuit diagram of a converter circuit illustrating an alternate embodiment of the present invention.

In FIG. 4 there is seen a converter circuit 10B representing yet another embodiment of the present invention. Circuit 10B is connected between a CMOS logic circuit 12 and an ECL logic circuit 14 in the same manner as the converter circuit 10 in FIG. 1. Converter circuit 10B has, however, fewer components than the circuit 10.

Converter circuit 10B consists of P-channel MOS transistors QP1 and QP2, connected in parallel between $V_{DD}$ and the output $V_{OUT}$ in the same manner as the converter circuit 10 in FIG. 1. However, unlike the embodiment of FIG. 1, QP1 has its gate connected to the supply voltage $V_{SS}$ and QP2 has its gate connected to the output of the CMOS circuit 12. As a consequence, QP1 is always enabled; QP2 is enabled when the output of the CMOS circuit 12 (and $V_{IN}$) is at a logic level "0" and is disabled when the output of the CMOS circuit 12 is at a logic level "1".

In operation, when $V_{IN}$ is at a logic level "1", QP2 is disabled and the effective resistance across the parallel transistors QP1 and QP2 is simply the drain-to-source resistance $R_{effQP1}$ of QP1. When $V_{IN}$ is at a logic level "0", both QP1 and QP2 are enabled, and the effective resistance across the transistors is given by the conventional formula for calculating the resistance of parallel resistors:

$$R_{effQP} = \frac{R_{effQP1} R_{effQP2}}{R_{effQP1} + R_{effQP2}}$$

(Equation 6)

By using the previously stated Equations 3 and 4, one can calculate the aspect ratio required for transistors QP1 and QP2 in FIG. 4 as follows:

$$\left(\frac{W}{L}\right)_{QP1} = \left\{R_{TERM}\left(\frac{\mu\epsilon}{t_{ox}}\right)|V_{gs} - V_{th}|\right\} -$$

(Equation 7a)

$$1\frac{V_{TERM} - V_{ECLLOW}}{V_{ECLLOW} - V_{DD}}$$

(Equation 7b)

$$\left(\frac{W}{L}\right)_{QP2} = \left\{\left(\frac{\mu\epsilon}{t_{ox}}\right)|V_{gs} - V_{th}|\right\} -$$

$$\left[\frac{V_{TERM} - V_{ECLHIGH}}{R_{TERM}(V_{ECHIGH} - V_{DD})} - \frac{W}{L}QP1\right]$$

Since the effective resistance across the transistors QP1 and QP2 is lower when QP2 is enabled, the voltage at $V_{OUT}$ is greater when the input $V_{IN}$ is at a logic level "0" (enabling QP2). As a consequence, the circuit 10B will always invert the input $V_{IN}$.

It can thus be seen that there has been provided by the present invention an improved signal converter circuit that is simple in construction and inexpensive to produce.

Although the presently preferred embodiments of the invention have been described, it will be understood that various changes may be made within the scope of the appended claims.

What is claimed is:

1. A converter circuit for converting a first set of logic signals into a second set of logic signals, comprising:
   an input for being connected to a source of the first set of logic signals;
   an output for being connected to a circuit using the second set of logic signals;
   a power terminal connected for receiving a power signal;
   a first transistor having first, second and control terminals; and
   a second transistor having first, second and control terminals;
   said first transistor and said second transistor connected in parallel, with the first terminal of each connected to said power terminal and with the second terminal of each connected to said output terminal;
   the circuit at said output terminal having a resistance associated therewith forming a voltage divider with said parallel-connected first and second transistors;

said first transistor and said second transistor having their respective control terminals connected so that said first transistor is enabled in response to a first level signal in the first set of logic signals and said second transistor is enabled in response to second level signal in the first set of logic signals; and said first transistor when enabled having a different resistance between its first terminal and its second terminal than the resistance of said second transistor between its first and second terminals.

2. The converter circuit of claim 1, wherein the control terminal of said first transistor is connected for receiving the first set of logic signals, wherein the converter circuit further comprises an inverter connected also for receiving the first set of logic signals and inverting the same, and wherein the control terminal of said second transistor is connected for receiving the inverted signals from said inverter.

3. The converter circuit of claim 1, wherein the source of the first set of logic signals is a CMOS device and wherein the circuit using the second set of logic signals is an ECL device.

4. The converter circuit of claim 3, wherein said first and second transistors are of the same conductivity type.

5. The converter circuit of claim 4, wherein said first and second transistors are each P-channel MOS transistors.

6. The converter circuit of claim 1, further comprising a clamping transistor connected between the second terminals of said first and second transistors and said output, said clamping terminal limiting the current flow to said output.

7. A signal converter circuit for converting a first set of logic signals at its input into into a second set of logic signals at its output, comprising:

first and second output transistors responding to the first set of logic signals and providing the second set of logic signals;

said second set of logic signals provided by the converter circuit to a circuit having a resistance associated therewith;

said output transistors connected in parallel between a voltage source and the output of said converter and forming a voltage divider with the resistance of the circuit to which the second set of logic signals is provided, with at least one of said first and second output transistors enabled in response to a first signal of the first set of logic signals and disabled in response to a second signal of the first set of logic signals so that the effective resistance across the parallel-connected first and second output transistors is different when the first signal is received at the converter circuit and when the second signal is received.

8. A converter circuit for converting one set of logic signal from a first circuit into a second set of logic signals for a second circuit, said converter circuit comprising:

a first transistor;

a second transistor connected in parallel with said first transistor;

said first and second transistors forming a voltage divider with a resistance associated with said second circuit; and means for enabling said first and second transistors so that at least one of said transistors is enabled in response to a first signal in said one set of logic signals and said one of said transistors is disabled in response to a second signal in said second set of logic signals;

said first and second transistors having a resistance associated therewith when enabled, with the resistance associated with the first transistor different than the resistance associated with the second transistor, so that the voltage across the resistance associated with the second circuit is at one level in response to the first signal and at a second level in response to the second signal.

* * * * *